(12) United States Patent
Freeborn

(10) Patent No.: US 9,046,420 B2
(45) Date of Patent: Jun. 2, 2015

(54) INFRARED LIGHT DETECTOR HAVING HIGH RESOLUTION

(75) Inventor: Scott Freeborn, Edinburgh (GB)

(73) Assignee: Pyreos Ltd., Edingburgh (GB)

( * ) Notice: Subject to any disclaimer, the term of this patent is extended or adjusted under 35 U.S.C. 154(b) by 489 days.

(21) Appl. No.: 13/258,914

(22) PCT Filed: Mar. 18, 2010

(86) PCT No.: PCT/EP2010/053549
§ 371 (c)(1),
(2), (4) Date: Dec. 6, 2011

(87) PCT Pub. No.: WO2010/108851
PCT Pub. Date: Sep. 30, 2010

(65) Prior Publication Data
US 2012/0068072 A1    Mar. 22, 2012

(30) Foreign Application Priority Data
Mar. 26, 2009  (DE) .......................... 10 2009 001 920

(51) Int. Cl.
| G01J 5/02 | (2006.01) |
| G01J 5/34 | (2006.01) |
| H01L 31/024 | (2014.01) |
| H01L 31/09 | (2006.01) |

(52) U.S. Cl.
CPC ................ G01J 5/34 (2013.01); G01J 5/0225 (2013.01); H01L 31/024 (2013.01); H01L 31/09 (2013.01)

(58) Field of Classification Search
CPC ................................ G01J 5/34; H01L 31/101
USPC .......................................................... 250/338.3
See application file for complete search history.

(56) References Cited

U.S. PATENT DOCUMENTS

| 4,147,241 A | 4/1979 | Preniczny et al. |
| 5,193,911 A * | 3/1993 | Nix et al. ...................... 374/121 |
| 5,962,854 A | 10/1999 | Endo |
| 6,399,947 B2 | 6/2002 | Yagyu et al. |
| 6,675,644 B2 | 1/2004 | Yamakawa et al. |
| 2001/0020681 A1 | 9/2001 | Yagyu et al. |

FOREIGN PATENT DOCUMENTS

| CN | 1300934 A | 6/2001 |
| EP | 0 454 398 A2 | 10/1990 |
| JP | 60119426 A | 6/1985 |
| JP | 07174623 A * | 7/1995 ............... G01J 1/02 |
| JP | 07174623 A | 7/1995 |

OTHER PUBLICATIONS

Chinese Search Report in Chinese Patent Application 2010800223122.

* cited by examiner

*Primary Examiner* — Casey Bryant
(74) *Attorney, Agent, or Firm* — Edell, Shapiro & Finnan, LLC

(57) ABSTRACT

An infrared light detector has a carrier membrane with at least two sensor chips thereon located next to each other. The carrier membrane has at least two rows of holes therein, proceeding parallel to each other between the sensor chips. The respective holes in one of the rows are offset with respect to the holes in an adjacent row, thereby hindering heat transmission via the carrier membrane between the sensor chips.

15 Claims, 3 Drawing Sheets

Detail A

INFRARED LIGHT DETECTOR HAVING HIGH RESOLUTION

BACKGROUND OF THE INVENTION

1. Field of the Invention

The invention concerns an infrared light detector with high resolution and high structural density.

2. Description of the Prior Art

It is known to use infrared light to detect gas. With a suitable light source the gas to be detected is exposed with infrared light, wherein a portion of the infrared light is absorbed by the gas such that a residual light remains. The residual light can be measured with an infrared light sensor with which the wavelength range and/or the intensity of the residual light can be detected and correspondingly transduced into an electrical signal. Given a suitable evaluation, the type and content of the detected gas can be concluded based on the electrical signal.

The infrared light detector has a number of sensor chips that are arranged in a grid arrangement on a carrier membrane. The sensor chips are conventionally produced from a layer with pyroelectrically sensitive material, for example lead-zirconate-titanate (PZT). The carrier membrane is conventionally produced from silicon. The sensor chips are electronically wired with electrodes that, for example, are produced from platinum or a chromium-nickel alloy absorbing the infrared radiation.

The sensor chips are attached to the carrier membrane and in contact with it in a thermally conductive manner. The sensor chips are therefore coupled with one another in a thermally conductive manner via the carrier membrane. The thermal conduction through the carrier membrane from one sensor chip to the other sensor chip is defined by the coefficient of thermal conductivity of the carrier membrane and the thickness of the carrier membrane. If one of the sensor chips is exposed with the infrared light, the sensor chip is heated due to absorption of the infrared light by the sensor chip. The heat is transferred from the sensor chip to the carrier membrane via thermal conduction, wherein a temperature equalization occurs in the carrier membrane and the other sensor chips. A sensor chip that, for example, is not activated due to a momentary infrared light exposure is heated by a different sensor chip located in its surroundings, which has the consequence of an unwanted activation of this sensor chip. This effect is known as thermal crosstalk, and it is desired that it be suppressed as much as possible in an infrared light detector so that the infrared light detector has a high resolution.

It is known to reduce the negative influence of the thermal crosstalk in that the distance between the sensor chips is chosen to be as large as possible. It is thereby achieved that the heating of a sensor chip by adjacently arranged sensor chips can remain within a tolerable range given a provided temperature gradient in the carrier membrane. However, this measure has the disadvantage that the areal extent of the infrared light detector is too large due to the large distances between the sensor chips.

SUMMARY OF THE INVENTION

It is an object of the invention to achieve an infrared light detector that has both a high resolution and a high integration density.

The infrared light detector according to the invention has a carrier membrane as well as at least two sensor chips that are attached next to one another on the carrier membrane, said carrier membrane has at least two tracks of holes, i.e., hole tracks, running parallel to one another between the sensor chips, the hole tracks respectively having a plurality of holes situated one after another; wherein the holes of the one hole track are offset with respect to the holes of the adjacent other hole track; wherein a thermal conduction in the carrier membrane from the one sensor chip to the other sensor chip is hindered by the hole tracks.

The thermal conduction from the one sensor chip to the other sensor chip takes place in the material of the carrier membrane. In that material of the carrier membrane is removed at the holes of the hole track, thermal conduction is suppressed via the holes. Only the material of the carrier membrane that resides between the holes thus remains for the heat transfer from the one sensor chip to the other sensor chip. The holes of the adjacent hole tracks are offset, so the distance from the one sensor chip to the other sensor chip through the material of the carrier membrane meanders in the region of the hole tracks and thus is designed to be longer in comparison with the straight-line connection between two sensor chips. For this reason the path of the thermal conduction from the one sensor chip to the other sensor chip is extended through the material of the carrier membrane. The heat input into the one sensor chip with lower temperature by a sensor chip with higher temperature is thereby smaller. Crosstalk of the sensor chips due to heat exchange is thus reduced. The spatial resolution of the infrared light detector is thereby high, wherein the population density of the carrier membrane with the sensor chips is high.

The region of the carrier membrane that is provided with the hole tracks thermally insulates two adjacent sensor chips since a smaller amount of heat is transferred from the one sensor chip to the other sensor chip. For this reason the sensor chips can be heated quickly by the radiant heat, and the increase of the electrical signals of the sensor chips at the point in time of the incidence of the radiant heat on the sensor chips is advantageously steep. The infrared light detector according to the invention thus has a shorter response time.

With the holes of the hole tracks in the carrier membrane, this is thus designed so as to be perforated, wherein the strength of the carrier membrane is weakened. Nevertheless, the strength of the carrier membrane is sufficiently high due to the offset arrangement of the holes. The reject rate is thereby low in the manufacture of the infrared light detector.

According to the invention it is also the case that at least one thermal conductor strip is provided running between the sensor chips on the side of the carrier membrane that faces one of the sensor chips, said thermal conductor strip having a higher thermal conductivity than the carrier membrane and being connected in a thermally conductive manner with the sensor chips via the carrier membrane so that heat can be dissipated from the sensor chips with the thermal conductor strip, whereby the response time of the sensor chips is low.

Due to the insulation effect of the hole tracks, upon ending the thermal radiation the sensor chip can only be cooled slowly by heat discharge via the carrier membrane. This would have the consequence that the decline of the electrical signal is flat at the point in time of the absence of the thermal radiation on the sensor chip. The provision of the thermal conductor strip with which heat can be quickly conducted away from the sensor chip achieves a remedy, such that due to the heat discharge by means of the thermal conductor strip the sensor chip cools rapidly upon the absence of the thermal radiation by heat discharge via the thermal conductor strip. The decline of the electrical signal is thereby steep at the point in time of the absence of the thermal radiation at the sensor chip. The response time of the infrared light detector is thus low even though the infrared light detector can have a high population density with the sensor chips.

Moreover, according to the invention the thermal conductor strip is a thin film strip. The thin film strip can advantageously be attached on the carrier membrane, running between one of the sensor chips and the hole tracks, wherein the thin film strip does not need to project beyond the sensor elements, perpendicular to the carrier membrane. Heat is transferred to the thin film strip from the sensor chip adjacent to said thin film strip via the carrier membrane and is dissipated in this thin film strip, such that only a reduced heat flow can be achieved at the region of the carrier membrane in which the hole tracks are provided.

At least one rib is preferably attached, running between the sensor chips, on the side of the carrier membrane that faces away from said sensor chips, said rib having a higher thermal conductivity than the carrier membrane and being connected in a thermally conductive manner with the senor chips via the carrier membrane so that heat can be dissipated from the sensor chips with the rib, whereby the response time of the sensor chips is low. In that the rib is arranged on the side of the carrier membrane facing away from the sensor chips, the rib can preferably be attached in the region of the carrier membrane in which the hole tracks are provided. A portion of the heat flow that passes through the region of the carrier membrane with the hole tracks is thereby dissipated by the rib, such that the heat flow that passes from one sensor chip to the other sensor chip via the region of the carrier membrane with the hole tracks is reduced.

It is also preferred for at least one of the holes in the carrier membrane to form a blind hole and to be open on the side of the carrier membrane that faces towards the sensor chips; and/or that at least one other of the holes in the carrier membrane forms a blind hole and is open on the side of the carrier membrane that faces away from the sensor chips; and/or that at least one additional hole in the carrier membrane is formed as a via hole. If one of the holes is designed as a blind hole, the carrier membrane is not completely penetrated by the blind hole. The carrier membrane thereby has a stable structure, whereby the strength of the carrier membrane in the region of the hole tracks is increased. For example, if the carrier membrane is made up of two or more layers, silicon dioxide ($SiO_2$) can be chosen for one layer and silicon nitride ($Si_2Ni_3$) can be chosen for the other layer, for example. Silicon nitride has a higher thermal conductivity than silicon dioxide, such that the thermal conductivity in the carrier membrane occurs primarily in the silicon nitride layer. For example, if the blind hole is dimensioned so that it penetrates the silicon nitride layer, the thermal barrier effect of the hole tracks is high, wherein nevertheless the stabilizing effect of the remaining silicon dioxide layer in the region of the blind hole leads to a high strength of the carrier membrane. Moreover, a pressure difference between the one side of the carrier membrane and the other side of the carrier membrane can be accepted or, respectively, advantageously adjusted in the production and installation of the infrared light detector since a pressure compensation cannot occur via the carrier membrane if the holes are formed as blind holes.

At least one of the holes preferably has a round cross section, wherein alternatively at least one other of the holes has an oval cross section. The notch stress effect caused by the provision of the holes of the hole tracks in the carrier membrane is thereby reduced, whereby this carrier membrane has a high strength. The oval cross section preferably has its major semi-axis aligned with the course of the appertaining hole track. The strength of the material of the carrier membrane is thereby reduced between the individual holes of the appertaining hole track, whereby the heat flow through the carrier membrane is reduced transversal to the hole tracks.

At least two hole tracks situated directly next to one another and running parallel to one another are preferably provided between the two sensor chips. Three of the hole tracks are more preferably provided whose holes are offset in such a way that each of the holes in the middle hole track is respectively arranged in the center of a quadrilateral formed by the holes of the other hole tracks that are immediately adjacent to the middle hole. A compact arrangement with which both the thermal barrier effect in the carrier membrane and the strength of the carrier membrane are high is thereby formed with the holes. The length and/or width of the sensor chips is preferably in a range from 30 µm to 900 µm, and the diameter of the holes is preferably in a range from 100 nm to 50 µm. It is also preferred that the distance from hole to hole in one of the hole tracks is in a range from 0.5 to 2 times the diameter of the appertaining holes. Moreover, the distance from one of the holes of the one hole track to the other hole (the other hole being directly adjacent to the one of the holes) in the other hole track is in a range from 0.1 to 2 times the diameter of the appertaining holes.

DESCRIPTION OF THE PREFERRED EMBODIMENTS

Figure 1:
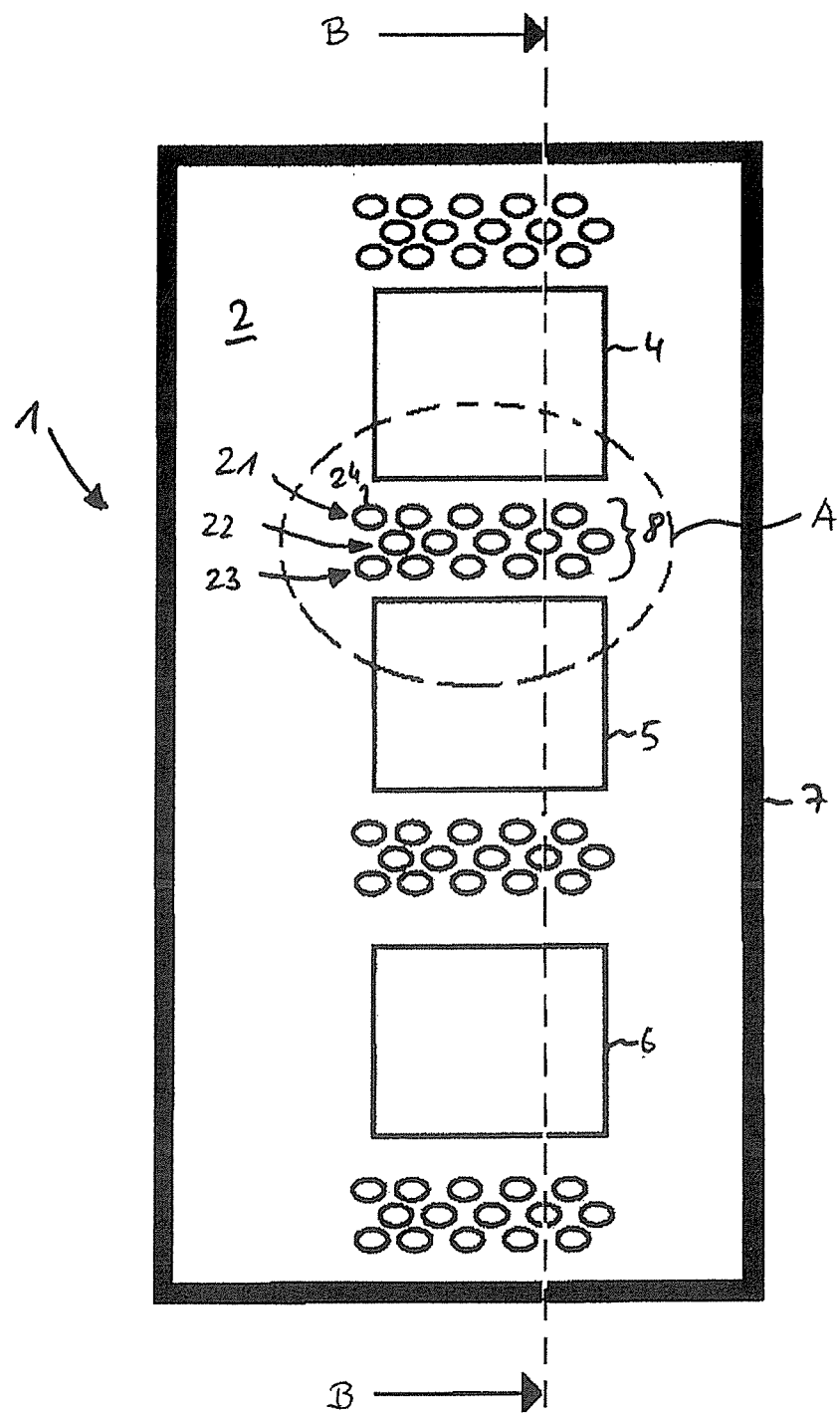
FIG. 1 is a plan view of an infrared light detector in accordance with the present invention.

As is clear from FIGS. 1 through 5, an infrared light detector 1 has a carrier membrane 2 that is designed with a membrane thickness 3. The carrier membrane 2 forms a substrate for a first sensor chip 4, a second sensor chip 5 and a third sensor chip 6. In FIG. 1, 3 through 5, the sensor chips 4 through 6 are attached equidistantly next to one another. Provided on the outer edge of said carrier membrane 2, on its underside, is a supporting frame 7 that surrounds the carrier membrane 2 and supports this.

The sensor chips 4 through 6 comprise pyroelectric material, such that upon their exposure with infrared light—in particular in a wavelength range between 3 through 20 µm—a corresponding electrical signal is present at the sensor chips 4 through 6.

Upon exposure of the sensor chips 4 through 6 with the infrared light, this is absorbed by the sensor chips 4 through 6 such that the sensor chips 4 through 6 heat up. Given a different heating of the sensor chips 4 through 6, a crosstalk of the sensor chips 4 through 6 arises, which is disadvantageous with regard to the measurement precision of the infrared light detector 1. To curtail crosstalk between the sensor chips 4 through 6, a thermal barrier 8 is respectively provided between the first sensor chip 4 and the second sensor chip 5 as well as between the second sensor chip 5 and the third sensor chip 6. The thermal barrier has a third hole track 23, wherein the hole tracks 21 through 23 run parallel to one another and the facing flanks of the sensor chips 4 through 6. The hole tracks 21 through 23 are arranged centrally between the respective sensor chips 4 through 6 and extend in the longitudinal direction such that the thermal barrier 8 protrudes from the sensor chips 4 through 6 at its longitudinal ends into that of the carrier membrane 2. The hole tracks 21 through 23 are formed by a row of holes, wherein the holes per hole track have an oval cross section whose larger diameter aligns with the course of the respective hole track 21 through 23.

Figure 2:
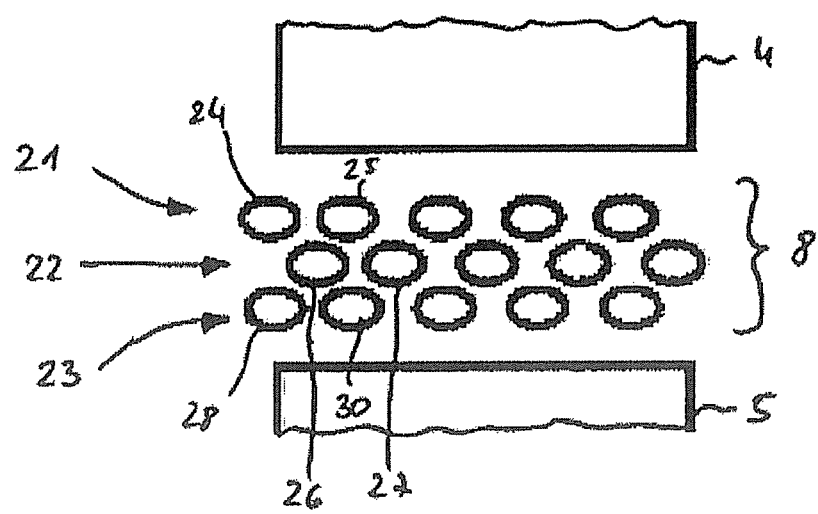
FIG. 2 shows a detail A from FIG. 1.

A first hole 24 and a second hole 25 of the first hole track 21, a third hole 26 and a fourth hole 27 of the second hole track 22, and a fifth hole 28 and a sixth hole 29 of the third hole track 23 are shown as examples in FIG. 2. The hole tracks 21 through 23 with their holes 24 through 29 are arranged offset, wherein the holes 24, 25, 28, 30 are arranged at the corners of an imaginary quadrilateral and the third hole 26 is arranged at the center point of this quadrilateral. A web of the carrier membrane 2 is formed between the first hole 24 and the second hole 25, said web continuing between the first hole 24 and the third hole 26, the third hole 26 and the fifth hole 28, and the fifth hole 28 and the sixth hole 29. The web is designed such that its path wanders, so a heat exchange between two of the sensor chips 4 through 6 occurs along the web. Due to the wandering path of the web, the path of the heat conduction —for example from the first sensor chip 4 to the second sensor chip 5 —is extended compared with the distance between said first sensor chip 4 and said second sensor chip 5. The heat input from the first sensor chip 4 (if this is heated more significantly than the second sensor chip 5) into the sensor chip 5 is thereby reduced, whereby the thermal barrier 8 hinders the heat transfer from the first sensor chip 4 to the second sensor chip 5. A crosstalk from the first sensor chip 4 to the second sensor chip 5 is thus reduced. The thermal barrier 8 acts in a similar manner between the other sensor chips 5, 6.

Figure 3:
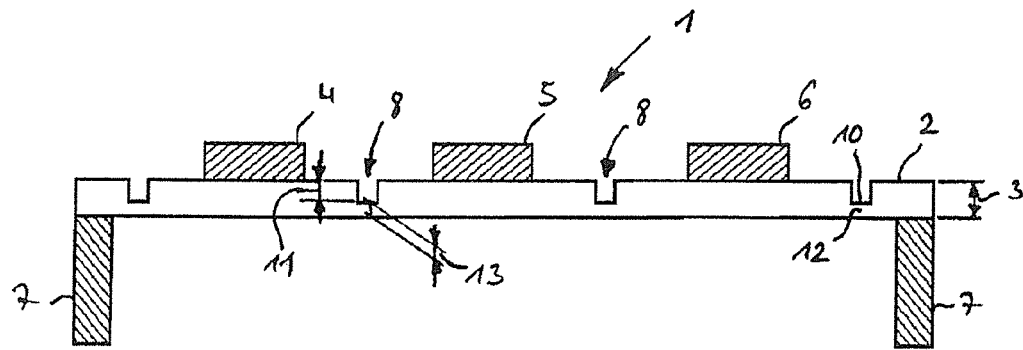
FIGS. 3-5 respectively show cross-sections of different exemplary embodiments of the infrared light detector in accordance with the invention.

The section B-B in FIG. 1 is shown in FIG. 3. The holes 24 through 29 are formed as blind holes that respectively have a blind hole base 10. The material of the carrier membrane 2 is formed as a floor 12 at the blind hole base 10. The cross section of the floor 12 results from the difference between the membrane thickness 3 and the blind hole depth 12. In that the web cross sections 13 are smaller than the membrane thickness 3, the heat transfer through the carrier membrane 2 transversal to the thermal barrier 8 is reduced.

Figure 4:
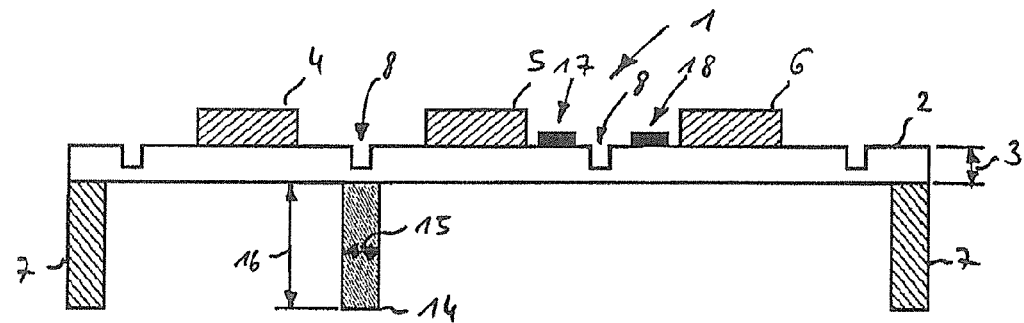

In the embodiment of FIG. 4, a rib 14 that is connected in a thermally conductive manner with the carrier membrane 2 is arranged on the carrier membrane 2, below the thermal barrier 8. Heat that passes through the floor 12 is thereby dissipated by the rib 14 and can be output to the surroundings of the rib 14 or to a component adjoining and in physical contact with this. The rib 14 thereby has the function of a heat sink whose thermal properties are in particular defined by the rib width 15 and the rib height 16.

In a further embodiment in FIG. 4, a first thin film strip 17 is attached on the carrier membrane 2 between the second sensor chip 5 and the thermal barrier 8 and a second thin film strip 18 is attached on the carrier membrane 2 between the third sensor chip 6 and the thermal barrier 8. Heat can be conducted away from the sensor chips 5, 6 with the thin film strips 17, 18. The material of the thin film strips 17, 18 preferably has a coefficient of thermal conductivity that is higher than the coefficient of thermal conductivity of the material of the carrier membrane 2. The thin film strips 17, 18 act as a heat sink whose thermal properties are defined by the thin film strip height 19 and the thin film strip width 20.

Figure 5:
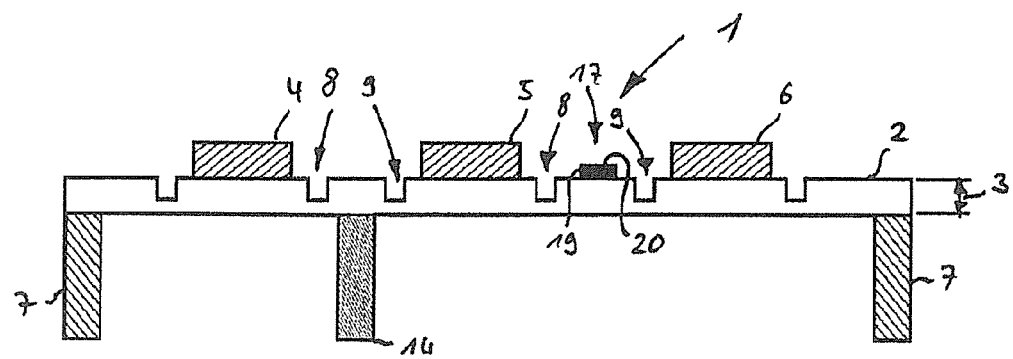

In another embodiment shown in FIG. 5, a first thermal barrier 8 and a second thermal barrier 9 are arranged next to one another between the first sensor 4 and the second sensor 5. The rib 14 is arranged between the first thermal barrier 8 and the second thermal barrier 9, analogous to FIG. 4. The portion of heat that has passed the first thermal barrier 8 and/or the second thermal barrier 9 can thereby be discharged by the rib 14. In the further embodiment in FIG. 5, the thin film strip 17 resides between the first thermal barrier 8 and the second thermal barrier 9. The heat that has passed the first thermal barrier 8 and/or the second thermal barrier 9 can be discharged with the thin film strip 17.

Although modifications and changes may be suggested by those skilled in the art, it is the intention of the inventor to embody within the patent warranted hereon all changes and modifications as reasonably and properly come within the scope of his contribution to the art.

The invention claimed is:

1. An infrared light detector comprising:
a carrier membrane;
at least two infrared sensor chips attached next to each other on a side of said carrier membrane;
said carrier membrane comprising at least two hole tracks each comprising a plurality of holes, wherein at least one of the plurality of holes forms at least one blind hole open at the side of the carrier membrane at which said at least two sensor chips are located or having an opening at an opposite side of said carrier membrane opposite to the side of said carrier membrane at which said at least two sensor chips are located, said at least two hole tracks being parallel to each other between the sensor chips on the carrier membrane, and respective locations of the plurality of holes of one of said hole tracks being offset relative to respective locations of the plurality of holes in another of said hole tracks adjacent thereto, causing thermal conduction in said carrier membrane from one of said sensor chips to another of said sensor chips to be hindered by said hole tracks; and
at least one thin film thermal conductor strip proceeding between adjacent sides of said at least two sensor chips on said side of said carrier membrane, said thermal conductor strip having a higher thermal conductivity than said carrier membrane and being in thermally conductive communication with said at least two sensor chips via said carrier membrane to dissipate heat from said at least two sensor chips via said thermal conductor strip to promote a low response time of said at least two sensor chips.

2. The infrared light detector as claimed in claim 1, wherein said carrier membrane comprises at least one rib located at an opposite side of said carrier membrane, opposite to said side on which said at least two sensor chips are located, said rib having a higher thermal conductivity than said carrier membrane and being in thermally conductive communication with said at least two sensor chips via said carrier membrane to also assist in dissipating heat from said sensor chips via said rib to reduce said response time of said sensor chips.

3. The infrared light detector as claimed in claim 2, wherein said rib projects from said carrier membrane by an extent corresponding to at least a thickness of said carrier membrane.

4. The infrared light detector as claimed in claim 1, wherein said holes include through holes that proceed completely through said carrier membrane.

5. The infrared light detector as claimed in claim 1, wherein at least one of said holes has a circular cross-section.

6. The infrared light detector as claimed in claim 1, wherein at least one of said holes has an oval cross-section.

7. The infrared light detector as claimed in claim 6, wherein said oval cross-section has a major semi-axis aligned with a curve of the hole track in which said hole having the oval cross-section is located.

8. The infrared light detector as claimed in claim 1, wherein said at least two hole tracks are directly adjacent to each other and proceed parallel to each other and are located between said at least two sensor chips in said carrier membrane.

9. The infrared light detector as claimed in claim 1, comprising three hole tracks comprising a middle hole track and two outer hole tracks on opposite sides of said middle hole track, the holes in said outer hole tracks being offset relative to the holes of the middle hole track which each hole in said middle hole track being at a center of a quadrilateral formed by respective holes of said outer hole tracks.

10. The infrared light detector as claimed in claim 1, wherein said sensor chips have a length and a width in a range between 30 and 900 µm, and wherein said holes in said hole tracks each have a diameter in a range between 100 nm and 50 µm.

11. The infrared light detector as claimed in claim 1, wherein a distance between holes in any of said hole tracks is in a range between 0.5 and 2 times a diameter of said holes in said hole tracks.

12. The infrared light detector as claimed in claim 1, wherein a distance between respective holes in different hole tracks that are immediately adjacent to each other is in a range between 0.1 and 2 times a diameter of the respective holes.

13. The infrared light detector as claimed in claim 1, wherein said thermal conductor strip is in thermally conductive communication with said at least two sensor chips across said at least two hole tracks.

14. The infrared light detector as claimed in claim 1, wherein the at least one thin film thermal conductor strip proceeds between (a) one of said at least two sensor chips and (b) said at least two hole tracks on said side of said carrier membrane.

15. The infrared light detector as claimed in claim 2, wherein said at least one rib is attached to said carrier membrane at a location at which the at least one blind hole has the opening and at a side of the carrier membrane that is opposite to the side of the carrier membrane at which the at least one blind hole has the opening.

* * * * *